(12) United States Patent
Liu (10) Patent No.: US 12,040,376 B2
(45) Date of Patent: Jul. 16, 2024

(54) SEMICONDUCTOR DEVICE AND PREPARATION METHOD THEREOF

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 396 days.

(21) Appl. No.: 17/498,873

(22) Filed: Oct. 12, 2021

(65) Prior Publication Data

US 2022/0028995 A1 Jan. 27, 2022

Related U.S. Application Data (63) Continuation of application No. PCT/CN2021/088571, filed on Apr. 21, 2021.

(30) Foreign Application Priority Data

May 8, 2020 (CN) .......................... 202010381095.1

(51) Int. Cl.
*H01L 29/49* (2006.01)
*H01L 29/40* (2006.01)
*H01L 29/423* (2006.01)
*H10B 12/00* (2023.01)

(52) U.S. Cl.
CPC ........ *H01L 29/4958* (2013.01); *H01L 29/401* (2013.01); *H01L 29/4236* (2013.01); *H01L 29/42372* (2013.01); *H01L 29/4966* (2013.01); *H10B 12/053* (2023.02); *H10B 12/34* (2023.02)

(58) Field of Classification Search
CPC .............. H01L 29/4958; H01L 29/496; H01L 29/42372; H01L 29/4236; H10B 12/34; H10B 12/053
See application file for complete search history.

(56) References Cited

U.S. PATENT DOCUMENTS

| | | | |
|---|---|---|---|
| 2006/0118873 A1 | 6/2006 | Yamada et al. | |
| 2013/0023096 A1* | 1/2013 | Purtell ................. | H01L 21/324 438/270 |
| 2015/0279694 A1 | 10/2015 | Srivastava et al. | |

FOREIGN PATENT DOCUMENTS

| | | |
|---|---|---|
| CN | 1255752 A | 6/2000 |
| CN | 1543679 A | 11/2004 |
| CN | 1897250 A | 1/2007 |
| CN | 102881577 A | 1/2013 |
| CN | 106067482 A | 11/2016 |

(Continued)

OTHER PUBLICATIONS

Hidenori Miyagawa et al."Metal-Assisted Solid-Phase Crystallization Process for Vertical Monocrystalline Si Channel in 3D Flash Memory", https://sci-hub.se/10.1109/IEDM19573.2019.8993556. 2019 IEEE.

(Continued)

*Primary Examiner* — Joseph C. Nicely
(74) *Attorney, Agent, or Firm* — Kilpatrick Townsend & Stockton LLP (57) ABSTRACT

A semiconductor device, including: a substrate; a gate oxide layer located in or on the substrate; and a gate located on a surface of the gate oxide layer, the gate including a monocrystalline silicon layer.

15 Claims, 8 Drawing Sheets

(56) References Cited

FOREIGN PATENT DOCUMENTS

CN 106941120 A 7/2017

OTHER PUBLICATIONS

English translation of Written Opinion of the International Search Authority in the international application No. PCT/CN2021/088571, mailed on Jul. 9, 2021.
ISR for International Application PCT/CN2021/088571 mailed Jul. 9, 2021.

* cited by examiner

SEMICONDUCTOR DEVICE AND PREPARATION METHOD THEREOF

CROSS-REFERENCE TO RELATED APPLICATIONS

This application is a continuation of International Patent Application No. PCT/CN2021/088571 filed on Apr. 21, 2021, which claims priority to Chinese Patent Application No. 202010381095.1 filed on May 8, 2020. The above-referenced patent applications are incorporated herein by reference in their entirety.

TECHNICAL FIELD

The present disclosure relates to the field of semiconductors, and in particular to a semiconductor device and a preparation method thereof.

BACKGROUND

An existing DRAM (Dynamic Random Access Memory) with an RCAT (Recess Channel Array Transistor) has a buried-gate transistor with a metal gate made of metal tungsten. The metal tungsten with a relatively low resistance can reduce a wordline resistance. However, with the development of semiconductor technologies, the size of the device is getting smaller and smaller, and gate-induced drain leakage (GIDL) has a huge adverse effect on the formation of buried-gate transistors. A dual power function of a polysilicon gate and a metal gate can effectively reduce the GIDL effect, but polysilicon has a relatively high resistance, which will cause the gate resistance of the buried-gate transistor to be relatively high, thereby affecting the performance of the device.

SUMMARY

According to various embodiments, a semiconductor device and a preparation method thereof are provided.

A semiconductor device, including:
 a substrate;
 a gate oxide layer located in or on the substrate; and
 a gate located on a surface of the gate oxide layer, the gate including a monocrystalline silicon layer.

A preparation method of a semiconductor device, including:
 providing a substrate;
 forming a gate oxide layer in or on the substrate; and
 forming a gate on a surface of the gate oxide layer, the gate including a monocrystalline silicon layer.

In one of the embodiments, the forming a gate oxide layer in the substrate includes the following steps:
 forming a trench in the substrate; and
 forming the gate oxide layer on sidewalls of the trench and at a bottom of the trench.

In the above technical solution, the gate includes the monocrystalline silicon layer and a metal layer. On the gate, a region, prone to a GIDL effect, is made of monocrystalline silicon instead of a metal and thus the GIDL effect can be effectively reduced. Moreover, the monocrystalline silicon has a low impedance, which can effectively reduce the resistance of the gate.

BRIEF DESCRIPTION OF DRAWINGS

In order to better describe and illustrate embodiments of the present disclosure, reference may be made to one or more accompanying drawings. Additional details or examples used to describe the accompanying drawings should not be considered as limitations on the scope of any of the invention-creations, the embodiments described hereinafter, and the preferred embodiments of the present disclosure.

DESCRIPTION OF EMBODIMENTS

For easy understanding of the present disclosure, a more comprehensive description of the present disclosure will be given below with reference to the relevant drawings. Preferred embodiments of the present disclosure are given in the drawings. However, the present disclosure may be implemented in many different forms and is not limited to the embodiments described herein. Rather, these embodiments are provided to make the contents disclosed in the present disclosure more thorough and comprehensive.

Unless defined otherwise, all technical and scientific terms used herein have the same meanings as are commonly understood by those skilled in the art. The terms used herein in the specification of the present disclosure are for the purpose of describing specific embodiments only but not intended to limit the present disclosure. The term "and/or" used herein includes any and all combinations of one or more related listed items.

In the description of the present disclosure, it should be understood that the orientation or position relationship indicated by the terms "upper", "lower", "vertical", "horizontal", "inner", "outer", etc. are based on the orientation or position relationship shown in the accompanying drawings and are intended to facilitate the description of the present disclosure and simplify the description only, rather than indicating or implying that the apparatus or element referred to must have a particular orientation or be constructed and operated in a particular orientation, and therefore are not to be interpreted as limiting the present disclosure.

Figure 1:
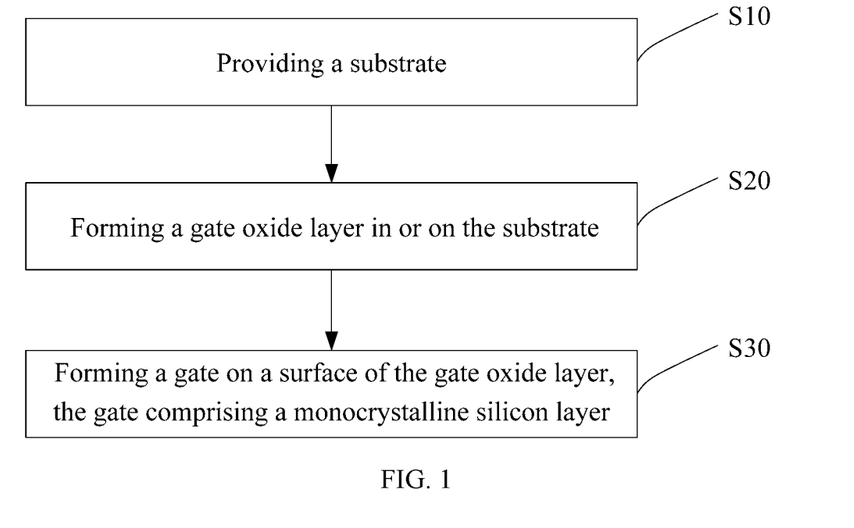
FIG. 1 is a flowchart of a preparation method of a semiconductor device according to an embodiment.

As shown in FIG. 1, according to an embodiment, provided is a preparation method of a semiconductor device, specifically including the following steps:

step S10: providing a substrate 10;

step S20: forming a gate oxide layer 11 in or on the substrate 10; and step S30: forming a gate 12 on a surface of the gate oxide layer 11, the gate 12 including a monocrystalline silicon layer 13.

Figure 3:
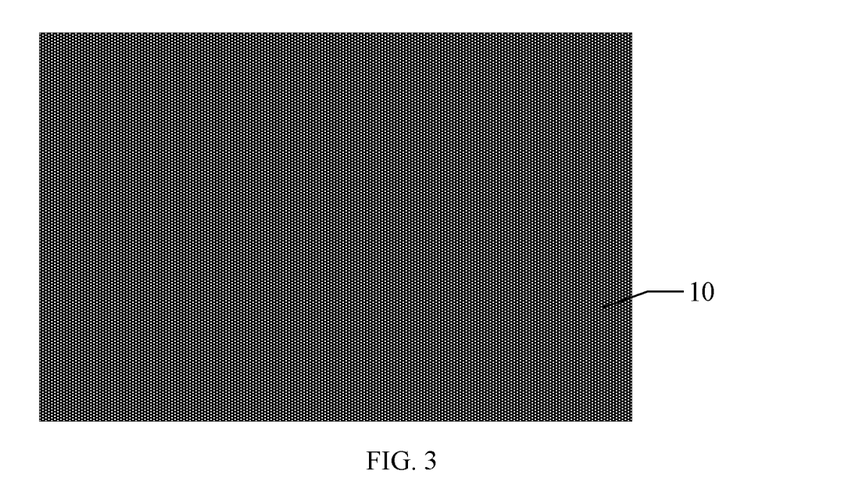
FIG. 3 is a schematic cross-sectional structural diagram according to an embodiment after formation of a substrate.

For step S10, as shown in FIG. 3, in an optional embodiment, a material of the substrate 10 may be silicon, germanium, GaAs (gallium arsenide), InP (indium phosphide), GaN (gallium nitride), or the like. That is, the substrate 10 may be a silicon substrate, a germanium substrate, a GaAs substrate, an InP substrate, or a GaN substrate; in this embodiment, the substrate 10 can be configured as a silicon substrate. Specifically, the substrate 10 may be provided therein with a doped well region, and the doped well region may be formed by performing ion implantation on the substrate 10; the doping type of the doped well region may be P-type or N-type.

For step S20, in an optional embodiment, the gate oxide layer 11 is formed on an upper surface of the substrate 10; specifically, the gate oxide layer 11 can be formed on the upper surface of the substrate 10 by, but not limited to, a thermal oxidation process. The gate oxide layer 11 may be formed as a silicon dioxide layer, a silicon monoxide layer, a hafnium oxide layer, a titanium oxide layer, or the like. In this embodiment, the gate oxide layer 11 can be formed as a silicon dioxide layer. It should be noted that in this embodiment, the gate oxide layer 11 can be etched together with the gate layer subsequently formed on the upper surface thereof to form a gate and a gate oxide layer of a desired structure.

In another optional embodiment, step S20 includes the following steps.

Figure 4:
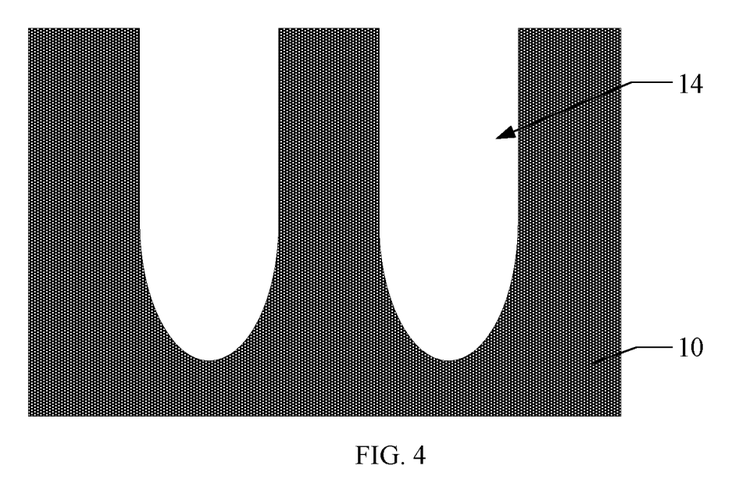
FIG. 4 is a schematic cross-sectional structural diagram according to an embodiment after formation of a trench.

In step S201, a trench 14 is formed in the substrate 10, as shown in FIG. 4.

Figure 6:
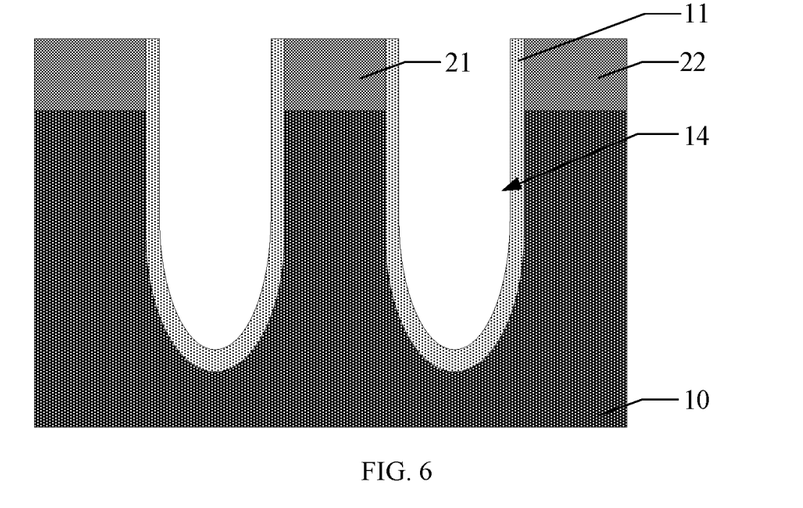
FIG. 6 is a schematic cross-sectional structural diagram according to an embodiment after formation of a gate oxide layer.

In step S202, a gate oxide layer 11 is formed on sidewalls of the trench 14 and at a bottom of the trench 14, as shown in FIG. 6.

Specifically, step S201 may include the following steps. Firstly, a mask layer (not shown) is formed on the surface of the substrate 10, and the mask layer may include a photoresist layer, an oxide layer, a nitride layer, or a carbon layer. Secondly, the mask layer is patterned to obtain a patterned mask layer (not shown); when the mask layer is formed as a photoresist layer, the photoresist layer can be patterned by exposure and development; and when the mask layer is formed as an oxide layer, a nitride layer or a carbon layer, the mask layer can be patterned by a photoetching process. Then, based on the patterned mask layer, the substrate 10 is etched to form a trench 14; the etching process may be dry etching or wet etching. Finally, the patterned mask layer is removed; specifically, the patterned mask layer may be removed by an ashing process, an etching process, or a chemical mechanical polishing process.

Specifically, a longitudinal section of the trench 14 may be U-shaped, rectangular, inverted trapezoid, or the like. In FIG. 4, the trench 14 having a U-shaped longitudinal section is illustrated as an example. The number of trenches 14 can be set according to actual needs, and is not limited here.

Specifically, step S202 may include the following steps. Firstly, a chemical vapor deposition process or a thermal oxidation process may be used to form a gate oxide material layer on an upper surface of the mask layer and the sidewalls of the trench 14 and at the bottom of the trench 14; then, a chemical mechanical polishing process can be used to remove the gate oxide material layer from the upper surface of the substrate 10, and only the gate oxide material layer on the sidewalls of the trench 14 and at the bottom of the trench 14 is retained as the gate oxide layer 11. The gate oxide layer 11 may be formed as a silicon dioxide layer, a silicon monoxide layer, a hafnium oxide layer, a titanium oxide layer, or the like. In this embodiment, the gate oxide layer 11 can be formed as a silicon dioxide layer.

In an optional embodiment, step S30 specifically includes the following steps.

Figure 7:
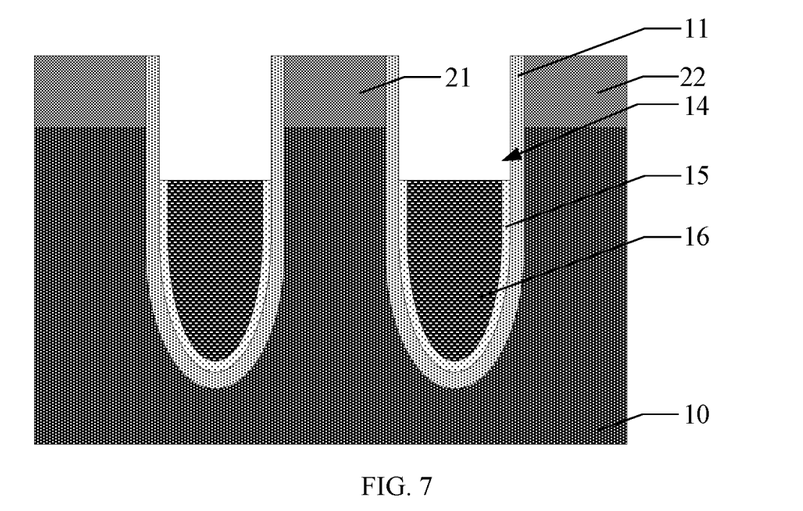
FIG. 7 is a schematic cross-sectional structural diagram according to an embodiment after formation of a first metal barrier layer and a metal layer.

In step S301, a first metal barrier layer 15 is formed on a surface of the gate oxide layer 11, as shown in FIG. 7.

In step S302, a metal layer 16 is formed on a surface of the first metal barrier layer 15, as shown in FIG. 7.

In step S303, a monocrystalline silicon layer 13 is formed on the metal layer 16.

In one embodiment, step S301 and step S302 can be combined. Specifically, the following steps are included. Firstly, a chemical vapor deposition process can be carried out to form a first metal barrier layer 15 (not shown) on the surface of the gate oxide layer 11 and the upper surface of the substrate 10. Secondly, a metal material layer (not shown) is formed on an upper surface of the first metal barrier material layer. Then, the first metal barrier material layer on the upper surface of the substrate 10 and the metal material layer on the upper surface of the substrate 10 are removed by a chemical mechanical polishing process or an etching process. Finally, the metal material layer and the first metal barrier material layer in the trench 14 are etched back to form a first metal barrier layer 15 and a metal layer 16.

Specifically, a material of the first metal barrier material layer may includes one or more of titanium, tantalum, tungsten, titanium nitride, tantalum nitride, tungsten nitride, silicon oxycarbide (SiOC), silicon carbonitride (SiCN), and silicon oxycarbonitride (SiOCN). The first metal barrier material layer is required to have good diffusion barrier properties, thin film properties, good stability at a high temperature, resistance to corrosion and oxidation, and good contact with semiconductors and metal and also required to have high conductivity but low ohmic contact resistance, so that the first metal barrier layer 15 can block the metal in the metal layer 16 from diffusing into the gate oxide layer 11, thereby avoiding an adverse effect on the performance of the device.

Specifically, the first metal barrier material layer may be formed by, but not limited to, a deposition process or an electroplating process, and the metal layer may be formed by, but not limited to, an electroplating process.

Specifically, an upper surface of the metal layer 16 may be flush with the upper surface of the first metal barrier layer 15, or may be slightly higher than the upper surface of the first metal barrier layer 15; more specifically, a height of the metal layer 16 is ¼ to ½ of a total depth of the gate 12, and the height of the metal layer 16 can be between 30 Å and 150 Å, and for example, may be 30 Å, 100 Å or 150 Å; however, the above data are only exemplary, and the specific value of the height of the metal layer 16 in an actual embodiment is not limited to the above data. The metal layer 16 may be configured as a tungsten layer, a copper layer, an aluminum layer, a nickel layer, a gold layer, a silver layer, or the like. In this embodiment, the metal layer 16 can be formed as a tungsten layer.

Figure 14:
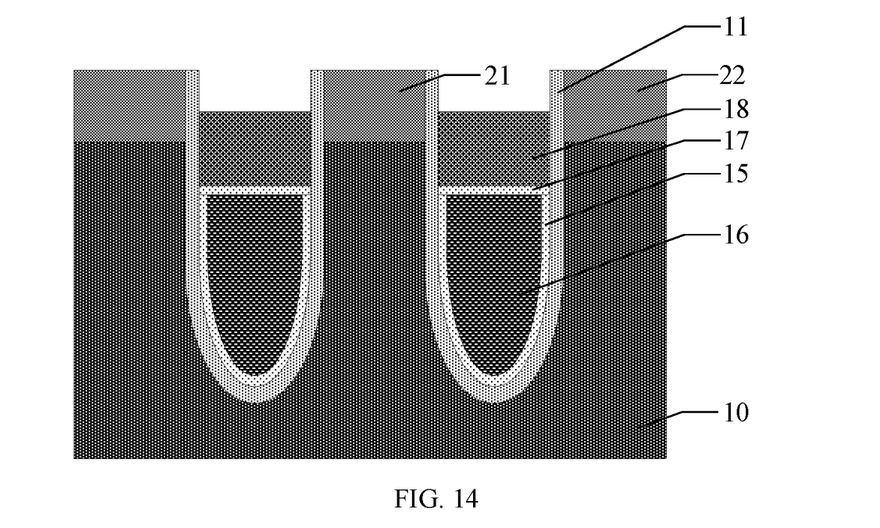
FIG. 14 is a schematic cross-sectional structural diagram according to an embodiment after formation of a second metal barrier layer and a polysilicon layer.

As shown in FIG. 14, in an optional embodiment, between step S302 and step S303, the method further includes: forming a second metal barrier layer 17 on the upper surface of the metal layer 16, wherein the second metal barrier layer 17 is located between the metal layer 16 and the polysilicon layer 18, and after the polysilicon layer 18 is transformed into the monocrystalline silicon layer 13, the second metal barrier layer 17 is located between the metal layer 16 and the monocrystalline silicon layer 13. A material of the second metal barrier layer 17 may include one or more of titanium, tantalum, tungsten, titanium nitride, tantalum nitride, tungsten nitride, silicon oxycarbide (SiOC), silicon carbonitride (SiCN) or silicon oxycarbonitride (SiOCN). The second metal barrier layer 17 can block the metal in the metal layer 16 from diffusing into the monocrystalline silicon layer 13, thereby avoiding an adverse effect on the performance of the device.

In an optional embodiment, step S303 specifically includes the following steps.

Figure 8:
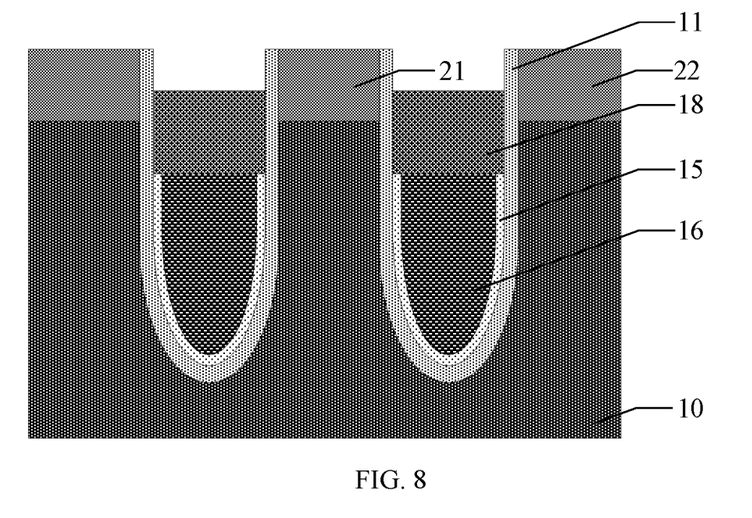
FIG. 8 is a schematic cross-sectional structural diagram according to an embodiment after formation of a polysilicon layer.

In step S3031, a polysilicon layer 18 is formed on the upper surface of the metal layer 16, as shown in FIG. 8.

Figure 9:
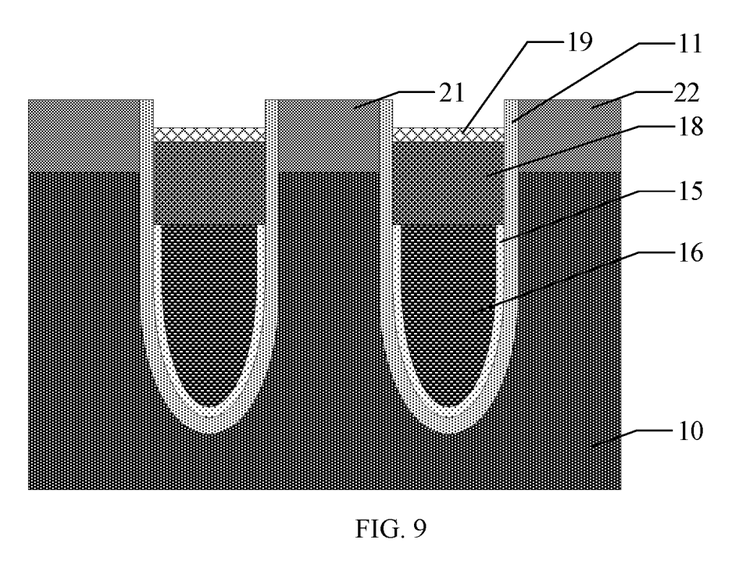
FIG. 9 is a schematic cross-sectional structural diagram according to an embodiment after formation of a metal silicide layer.

In step S3032, a metal silicide layer 19 is formed on an upper surface of the polysilicon layer 18, as shown in FIG. 9.

Figure 10:
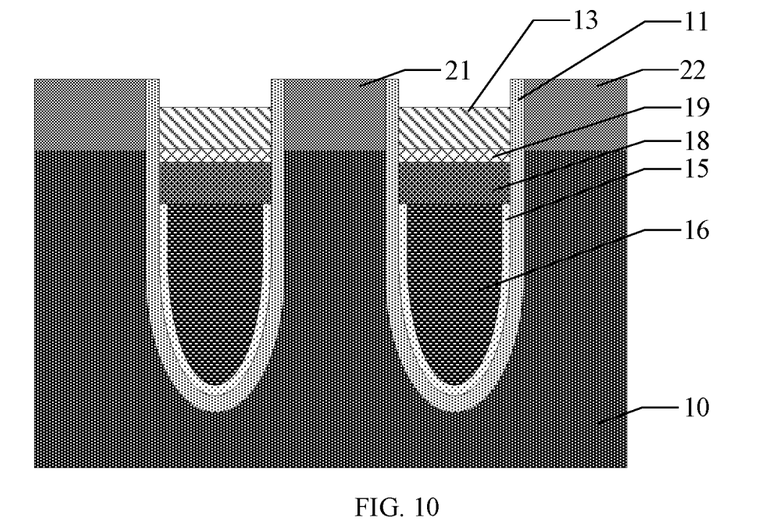
FIGS. 10 to 11 are schematic cross-sectional structural diagrams according to an embodiment after a metal silicide induces the transformation of a polysilicon layer into a monocrystalline silicon layer.
Figure 11:
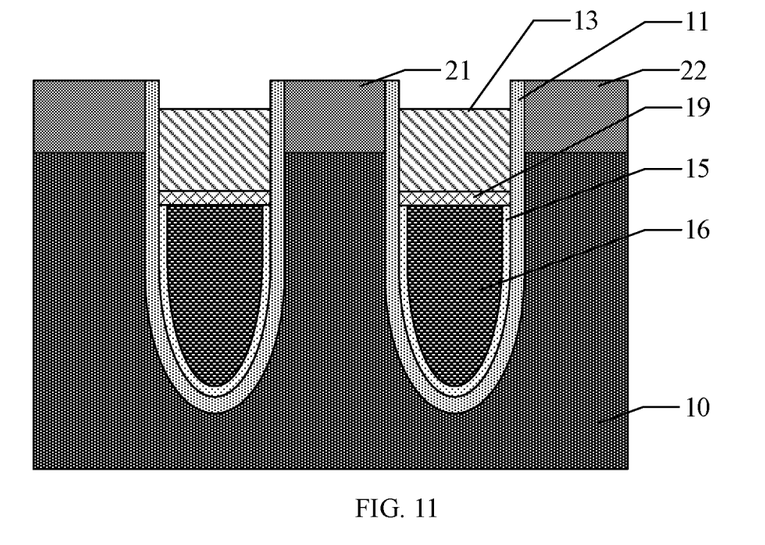

In step S3033, the polysilicon layer 18 is induced on the basis of the metal silicide layer 19, so that the polysilicon layer 18 is transformed into the monocrystalline silicon layer 13, and after the induction, the metal silicide layer 19 moves down to a position between the monocrystalline silicon layer 13 and the metal layer 16, as shown in FIG. 10 to FIG. 11.

Specifically, in step S3031, the polysilicon layer 18 may be formed on the upper surface of the metal layer 16 through a physical vapor deposition process, a chemical vapor deposition process, or an atomic layer deposition process. In step S3032, the metal silicide layer 19 may be formed by reacting the metal layer formed on the upper surface of the polysilicon layer 18 with the polysilicon layer 18, and the metal layer is formed on the upper surface of the polysilicon layer 18 through a chemical vapor deposition process or an electroplating process; the metal layer here may be formed as a nickel layer, a cobalt layer, or the like, and the formed metal silicide layer 19 may be formed as a nickel silicide layer or a cobalt silicide layer. In step S3033, the polysilicon layer 18 having the metal silicide layer 19 formed on the upper surface thereof may be subjected to crystallization annealing treatment, so that the silicide layer moves down to a position between the monocrystalline silicon layer 13 and the metal layer 16 and the polysilicon layer 18 is transformed into the monocrystalline silicon layer 13, wherein the crystallization annealing is carried out at a temperature between 500° C. and 600° C., specifically at 500° C., 550° C., or 600° C., for 2 h to 5 h, specifically for 2 h, 3.5 h or 5 h. However, the above data are only exemplary, and the specific values of the crystallization annealing temperature and the crystallization annealing time in an actual embodiment are not limited to the above data.

Figure 2:
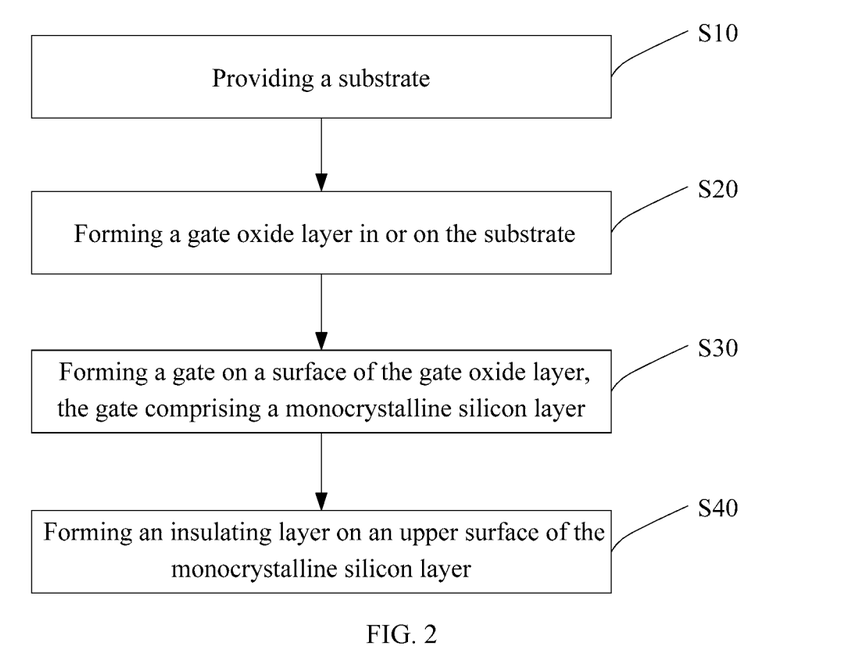
FIG. 2 is a flowchart of a preparation method of a semiconductor device according to another embodiment.
Figure 12:
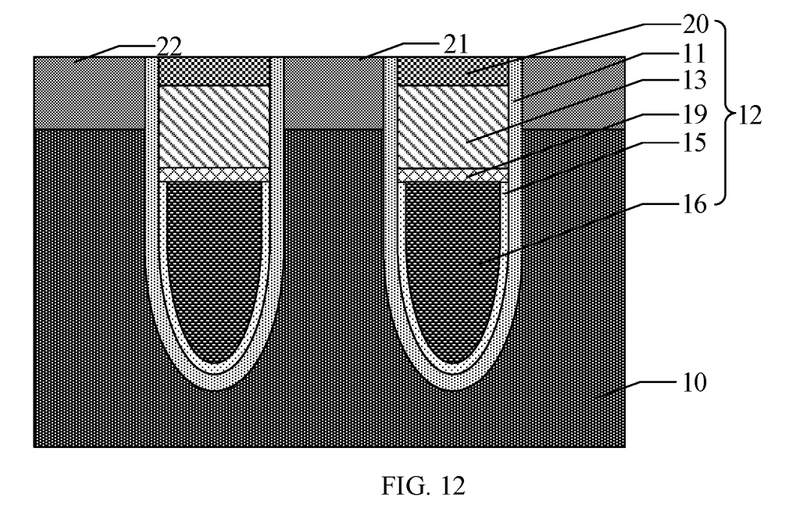
FIG. 12 is a schematic cross-sectional structural diagram according to an embodiment after formation of an insulating layer.
Figure 13:
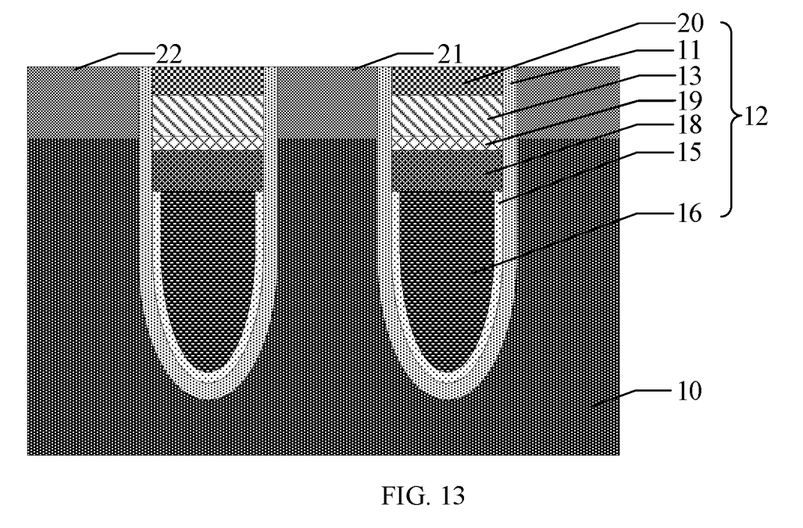
FIG. 13 is a schematic cross-sectional structural diagram according to another embodiment after formation of an insulating layer.
Figure 15:
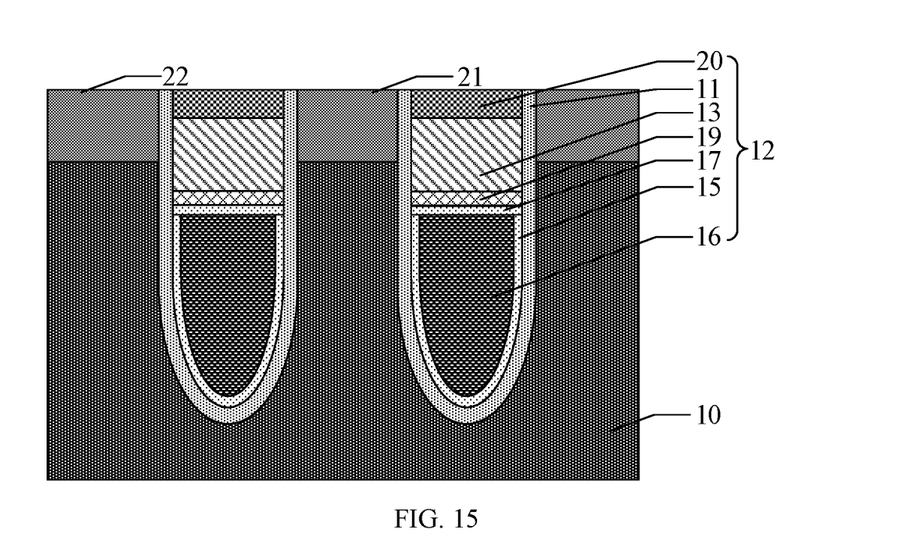
FIG. 15 is a schematic cross-sectional structural diagram according to other embodiments after formation of an insulating layer.

As shown in FIG. 2, in an optional embodiment, after step S30, step S40 is further included: forming an insulating layer 20 on an upper surface of the monocrystalline silicon layer 13, as shown in FIG. 12, FIG. 13, or FIG. 15.

Specifically, at least a part of the insulating layer 20 is located in the trench 14. More specifically, an upper surface of the insulating layer 20 may be flush with the upper surface of the substrate 10, and the insulating layer 20 may also fill up the trench 14 and extend and cover the upper surface of the substrate 10.

Specifically, the insulating layer 20 may include one or more of silicon nitride, silicon oxide, and silicon oxynitride.

Specifically, the insulating layer 20 may be formed by, but not limited to, a physical vapor deposition process, a chemical vapor deposition process, or an atomic layer deposition process.

In other optional embodiments, as shown in FIG. 13, under the induction of the metal silicide layer 19, the polysilicon layer 18 may also be not completely transformed into the monocrystalline silicon layer 13, but only part of the polysilicon layer 18 is transformed by the metal silicide Layer 19. In this case, a polysilicon layer 18 is further included between the metal layer 16 and the metal silicide layer 19.

Figure 5:
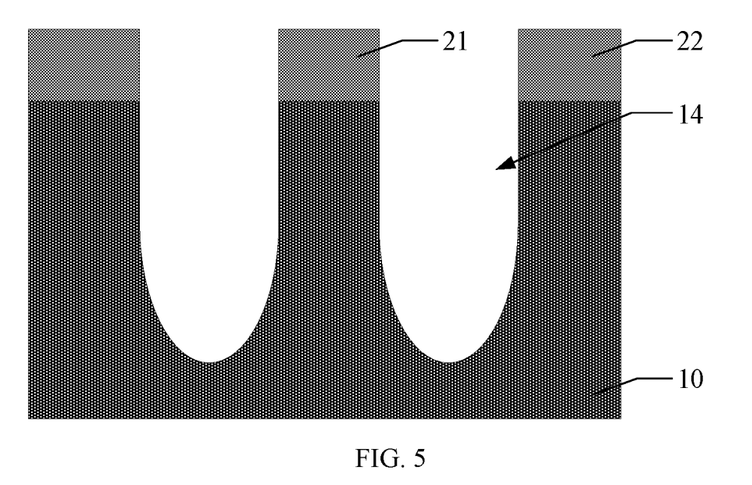
FIG. 5 is a schematic cross-sectional structural diagram according to an embodiment after formation of a source and a drain.

In an optional embodiment, ion implantation may be performed on the substrate 10 after the trench 14 is formed, to form a source 21 and a drain 22, and the source 21 and the drain 22 are respectively located in the substrate on two sides of the gate 12. In the semiconductor device, the gate 12 is electrically connected to a wordline, the drain 22 is electrically connected to a bitline, and the source 21 is electrically connected to a plate of a capacitor. In an optional embodiment, the wordline serves as a wordline in a DRAM array, the bitline serves as a bitline in the DRAM array, and the capacitor serves as a capacitor in the DRAM array.

In the semiconductor device obtained by the above-mentioned preparation method of a semiconductor device, the gate 12 includes the monocrystalline silicon layer 13 and the metal layer 16. On the gate 12, a region, prone to a GIDL effect, is made of monocrystalline silicon instead of a metal and thus the GIDL effect can be effectively reduced. Moreover, the monocrystalline silicon has a low impedance, which can effectively reduce the resistance of the gate 12.

Further referring to FIGS. 13 and 15, the present disclosure further provides a semiconductor device, including: a substrate 10; a gate oxide layer 11 located in or on the substrate 10; and a gate 12 located on a surface of the gate oxide layer 11, the gate 12 including a monocrystalline silicon layer 13.

In an optional embodiment, a material of the substrate 10 may be silicon, germanium, GaAs (gallium arsenide), InP (indium phosphide), GaN (gallium nitride), or the like. That is, the substrate 10 may be a silicon substrate, a germanium substrate, a GaAs substrate, an InP substrate, or a GaN substrate; in this embodiment, the substrate 10 can be a silicon substrate. Specifically, the substrate 10 may be provided therein with a doped well region, and the doped well region may be formed by performing ion implantation on the substrate 10; the doping type of the doped well region may be P-type or N-type.

In an optional embodiment, the gate oxide layer 11 is formed on an upper surface of the substrate 10. The gate oxide layer 11 may be formed as a silicon dioxide layer, a silicon monoxide layer, a hafnium oxide layer, a titanium oxide layer, or the like. In this embodiment, the gate oxide layer 11 can be formed as a silicon dioxide layer.

Specifically, a longitudinal section of the trench 14 may be U-shaped, rectangular, inverted trapezoid, or the like. In FIG. 13 and FIG. 15, the trench 14 having a U-shaped longitudinal section is illustrated as an example. The number of trenches 14 can be set according to actual needs, and is not limited here.

In another optional embodiment, the gate oxide layer 11 is formed in the substrate 10. The substrate 10 is provided therein with a trench 14, and the gate oxide layer 11 is located on sidewalls of the trench 14 and at a bottom of the trench 14. The gate oxide layer 11 may be formed as a silicon dioxide layer, a silicon monoxide layer, a hafnium oxide layer, a titanium oxide layer, or the like. In this embodiment, the gate oxide layer 11 can be formed as a silicon dioxide layer.

In an optional embodiment, the gate 12 further includes a metal layer 16, and the metal layer 16 is located on a surface of the gate oxide layer 11 and below the monocrystalline silicon layer 13. An upper surface of the metal layer 16 may be lower than a top of the trench 14, that is, the upper surface of the metal layer 16 is lower than the upper surface of the substrate 10. Specifically, the metal layer 16 may be configured as a tungsten layer, a copper layer, an aluminum layer, a nickel layer, a gold layer, a silver layer, or the like.

In an optional embodiment, the gate 12 further includes a first metal barrier layer 15 located between the metal layer 16 and the gate oxide layer 11, and an upper surface of the first metal barrier layer 15 is lower than a lower surface of the monocrystalline silicon layer 13. The first metal barrier layer 15 may be formed on the surface of the gate oxide layer 11 by a chemical vapor deposition process. A material of the first metal barrier layer 15 may include one or more of titanium, tantalum, tungsten, titanium nitride, tantalum nitride, tungsten nitride, silicon oxycarbide (SiOC), silicon carbonitride (SiCN) or silicon oxycarbonitride (SiOCN). The first metal barrier layer 15 is required to have good diffusion barrier properties, thin film properties, good stability at a high temperature, resistance to corrosion and oxidation, and good contact with semiconductors and metal and also required to have high conductivity but low ohmic contact resistance, so that the first metal barrier layer 15 can block the metal in the metal layer 16 from diffusing into the gate oxide layer 11, thereby avoiding an adverse effect on the performance of the device.

Specifically, an upper surface of the metal layer 16 may be flush with the upper surface of the first metal barrier layer 15, or may be slightly higher than the upper surface of the first metal barrier layer 15; more specifically, a height of the metal layer 16 is ¼ to ½ of a total depth of the gate 12, and the height of the metal layer 16 can be between 30 A and 150 A, and for example, may be 30 A, 100 A or 150 A; however, the above data are only exemplary, and the specific value of the height of the metal layer 16 in an actual embodiment is not limited to the above data.

In an optional embodiment, the gate 12 further includes a second metal barrier layer 17 located between a metal silicide layer 19 and the metal layer 16. A material of the second metal barrier layer 17 may include one or more of titanium, tantalum, tungsten, titanium nitride, tantalum nitride, tungsten nitride, silicon oxycarbide (SiOC), silicon carbonitride (SiCN) or silicon oxycarbonitride (SiOCN). The second metal barrier layer 17 can block the metal in the metal layer 16 from diffusing into the monocrystalline silicon layer 13, thereby avoiding an adverse effect on the performance of the device.

In an optional embodiment, the gate 12 further includes the metal silicide layer 19, which may be located between the monocrystalline silicon layer 13 and the metal layer 16. The monocrystalline silicon layer 13 in the gate 12 can be specifically formed by inducing the polysilicon layer 18 with the metal silicide layer 19. During the induction process, crystallization annealing for inducing polysilicon crystallization is carried out at a temperature between 500° C. and 600° C., specifically at 500° C., 550° C., or 600° C., for 2 h to 5 h, specifically for 2 h, 3.5 h or 5 h. However, the above data are only exemplary, and the specific values of the crystallization annealing temperature and the crystallization annealing time in an actual embodiment are not limited to the above data.

In an optional embodiments, the gate 12 further includes a polysilicon layer 18 located between the metal silicide layer 19 and the metal layer 16. That is, during the formation of the semiconductor device in this embodiment, the polysilicon layer 18 is not completely transformed into the monocrystalline silicon layer 13 under the induction of the metal silicide layer 19, but only part of the polysilicon layer 18 is transformed by the metal silicide Layer 19. In this case, the polysilicon layer 18 is further included between the metal layer 16 and the metal silicide layer 19.

In an optional embodiment, the gate 12 further includes an insulating layer 20 located above the monocrystalline silicon layer 13, and at least a part of the insulating layer 20 is located in the trench 14. More specifically, an upper surface of the insulating layer 20 may be flush with the upper surface of the substrate 10, and the insulating layer 20 may also fill up the trench 14 and extend and cover the upper surface of the substrate 10.

Specifically, the insulating layer 20 may include one or more of silicon nitride, silicon oxide, or silicon oxynitride.

In an optional embodiment, the semiconductor device may also include a source 21 and a drain 22. The source 21 and the drain 22 are located in the substrate 10 on two sides of the gate 12. The source 21 and the drain 22 may be formed by performing ion implantation on the substrate 10 after the trench 14 is formed.

In an optional embodiment, the gate 12 is electrically connected to a wordline, the drain 22 is electrically connected to a bitline, and the source 21 is electrically connected to a plate of a capacitor. In an optional embodiment, the wordline serves as a wordline in a DRAM array, the bitline serves as a bitline in the DRAM array, and the capacitor serves as a capacitor in the DRAM array.

In the semiconductor device obtained by the above-mentioned preparation method of a semiconductor device, the gate 12 includes the monocrystalline silicon layer 13 and the metal layer 16. On the gate 12, a region, prone to a GIDL effect, is made of monocrystalline silicon instead of a metal and thus the GIDL effect of the gate 12 can be effectively reduced. Moreover, the monocrystalline silicon has a low impedance, which can effectively reduce the resistance of the gate 12.

Technical features of the above embodiments may be combined randomly. To make descriptions brief, not all possible combinations of the technical features in the embodiments are described. Therefore, as long as there is no contradiction between the combinations of the technical features, they should all be considered as scopes disclosed in the specification.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure.

Therefore, the patent protection scope of the present disclosure should be subject to the appended claims.

What is claimed is:

1. A semiconductor device, comprising:
a substrate;
a gate oxide layer located in or on the substrate; and
a gate located on a surface of the gate oxide layer, the gate comprising a monocrystalline silicon layer;
wherein the substrate is provided therein with a trench, and the gate oxide layer is located on sidewalls of the trench and at a bottom of the trench; and
wherein the gate further comprises a metal layer and the metal layer is located on the surface of the gate oxide layer and below the monocrystalline silicon layer.

2. The semiconductor device according to claim 1, wherein the gate further comprises a first metal barrier layer, and the first metal barrier layer is located between the metal layer and the gate oxide layer.

3. The semiconductor device according to claim 2, wherein an upper surface of the first metal barrier layer is lower than a lower surface of the monocrystalline silicon layer.

4. The semiconductor device according to claim 3, wherein the gate further comprises a metal silicide layer, and the metal silicide layer is located between the monocrystalline silicon layer and the metal layer.

5. The semiconductor device according to claim 4, wherein the gate further comprises a second metal barrier layer, and the second metal barrier layer is located between the metal silicide layer and the metal layer.

6. The semiconductor device according to claim 4, wherein the gate further comprises a polysilicon layer, and the polysilicon layer is located between the metal silicide layer and the metal layer.

7. The semiconductor device according to claim 4, wherein the gate further comprises an insulating layer located above the monocrystalline silicon layer, and at least a part of the insulating layer is located in the trench.

8. The semiconductor device according to claim 7, wherein the gate oxide layer is formed as a silicon dioxide layer, the first metal barrier layer is formed as a titanium nitride layer, the metal layer is formed as a tungsten layer, the metal silicide layer is formed as a nickel silicide layer or a cobalt silicide layer, and the insulating layer includes one or both of silicon nitride and silicon oxynitride.

9. The semiconductor device according to claim 1, further comprising a source and a drain, the source and the drain being located in the substrate on two sides of the gate.

10. The semiconductor device according to claim 9, wherein the gate is electrically connected to a wordline, the drain is electrically connected to a bitline, and the source is electrically connected to a plate of a capacitor.

11. A preparation method of a semiconductor device, comprising:
providing a substrate;
forming a gate oxide layer in or on the substrate; and
forming a gate on a surface of the gate oxide layer, the gate comprising a monocrystalline silicon layer;
wherein forming a gate oxide layer in the substrate comprises:
forming a trench in the substrate; and
forming the gate oxide layer on sidewalls of the trench and at a bottom of the trench;
wherein forming a gate on a surface of the gate oxide layer comprises:
forming a first metal barrier layer on the surface of the gate oxide layer;
forming a metal layer on a surface of the first metal barrier layer; and
forming the monocrystalline silicon layer on the metal layer.

12. The method according to claim 11, wherein after forming the metal layer on the surface of the gate oxide layer and before forming the monocrystalline silicon layer on the metal layer, the method further comprises:
forming a second metal barrier layer on an upper surface of the metal layer, the second metal barrier layer being located between the metal layer and the monocrystalline silicon layer.

13. The method according to claim 12, the forming the monocrystalline silicon layer on the metal layer comprises:
forming a polysilicon layer on the upper surface of the metal layer;
forming a metal silicide layer on an upper surface of the polysilicon layer; and
inducing the polysilicon layer on the basis of the metal silicide layer so that the polysilicon layer is transformed into the monocrystalline silicon layer, wherein after the induction, the metal silicide layer moves down to a position between the monocrystalline silicon layer and the metal layer.

14. The method according to claim 13, wherein the inducing the polysilicon layer on the basis of the metal silicide layer comprises:
carrying out crystallization annealing treatment on the polysilicon layer having the metal silicide layer formed on the upper surface thereof so that the silicide layer moves down to a position between the monocrystalline silicon layer and the metal layer, and the polysilicon layer is transformed into the monocrystalline silicon layer.

15. The method according to claim 14, wherein the crystallization annealing is carried out at a temperature between 500° ° C. and 600° ° C. for 2 h to 5 h.

* * * * *